(12) United States Patent
Xu

(10) Patent No.: US 12,223,131 B2
(45) Date of Patent: Feb. 11, 2025

(54) FORCE SENSING MODULE AND ELECTRONIC DEVICE

(71) Applicant: VIVO MOBILE COMMUNICATION CO., LTD., Dongguan (CN)

(72) Inventor: Wei Xu, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 0 days.

(21) Appl. No.: 18/518,931

(22) Filed: Nov. 24, 2023

(65) Prior Publication Data

US 2024/0103655 A1 Mar. 28, 2024

Related U.S. Application Data

(63) Continuation of application No. PCT/CN2022/093291, filed on May 17, 2022.

(30) Foreign Application Priority Data

May 24, 2021 (CN) .......................... 202110565759.4

(51) Int. Cl.
*G06F 3/041* (2006.01)
*G01L 1/22* (2006.01)
*H05K 1/14* (2006.01)

(52) U.S. Cl.
CPC .......... *G06F 3/0414* (2013.01); *G01L 1/2262* (2013.01); *H05K 1/147* (2013.01);
(Continued)

(58) Field of Classification Search
None
See application file for complete search history.

(56) References Cited

U.S. PATENT DOCUMENTS

| 10,197,459 B2 * | 2/2019 | Keller ..................... G01L 1/146 |
| 2011/0023630 A1 * | 2/2011 | Zandman .............. G01L 1/2243 |
| | | 29/595 |

(Continued)

FOREIGN PATENT DOCUMENTS

| CN | 101111751 A | * 1/2008 | ........... G01L 1/2231 |
| CN | 105224129 A | * 1/2016 | ........... G06F 3/0414 |

(Continued)

OTHER PUBLICATIONS

CN-101111751-A (Year: 2008).*
(Continued)

*Primary Examiner* — Dorothy Harris
(74) *Attorney, Agent, or Firm* — IPX PLLC

(57) ABSTRACT

A force sensing module is provided. The force sensing module includes: a first flexible circuit board, a substrate, and a second flexible circuit board stacked in sequence. The substrate includes a first surface and a second surface opposite to the first surface, and the first surface is provided with a first groove. A first force sensing resistor and a second force sensing resistor are disposed on a first side of the first flexible circuit board facing the first surface. A third force sensing resistor corresponding to the first force sensing resistor and a fourth force sensing resistor corresponding to the second force sensing resistor are disposed on a second side of the second flexible circuit board facing the second surface. The four resistors form a Wheatstone bridge structure. The force sensing module includes a detection circuit, configured to detect a differential voltage of the Wheatstone bridge structure.

16 Claims, 5 Drawing Sheets

(52) U.S. Cl.
CPC ............. *G06F 2203/04105* (2013.01); *H05K 2201/10022* (2013.01)

(56) References Cited

U.S. PATENT DOCUMENTS

| | | | | |
|---|---|---|---|---|
| 2015/0128725 | A1* | 5/2015 | Ichige | ........................ G01L 1/22 |
| | | | | 73/862.045 |
| 2017/0329448 | A1* | 11/2017 | Li | .......................... G06F 3/0412 |
| 2018/0172527 | A1* | 6/2018 | Kim | ....................... G01L 5/1627 |
| 2019/0094007 | A1* | 3/2019 | Li | .............................. G01L 9/02 |
| 2019/0187767 | A1 | 6/2019 | Li et al. | |
| 2019/0368952 | A1* | 12/2019 | Li | ........................... G06F 3/016 |
| 2022/0326101 | A1* | 10/2022 | Li | .......................... G01L 1/2293 |
| 2023/0055731 | A1* | 2/2023 | Li | .............................. G01L 1/18 |

FOREIGN PATENT DOCUMENTS

| CN | 206741451 | U | | 12/2017 | | |
|---|---|---|---|---|---|---|
| CN | 107885390 | A | * | 4/2018 | ........... | G06F 3/0412 |
| CN | 109917946 | A | | 6/2019 | | |
| CN | 110192172 | A | | 8/2019 | | |
| CN | 111998976 | A | | 11/2020 | | |
| CN | 113282192 | A | | 8/2021 | | |

OTHER PUBLICATIONS

CN-105224129-A (Year: 2016).*
CN-107885390-A (Year: 2018).*
International Search Report issued in corresponding International Application No. PCT/CN2022/093291, mailed Aug. 16, 2022, 4 pages.
First Office Action issued in related Chinese Application No. 202110565759.4, mailed Feb. 23, 2023, 6 pages.
Second Office Action issued in related Chinese Application No. 202110565759.4, mailed Oct. 17, 2023, 6 pages.

* cited by examiner

FORCE SENSING MODULE AND ELECTRONIC DEVICE

CROSS-REFERENCE TO RELATED APPLICATIONS

This application is a continuation of International Application No. PCT/CN2022/093291, filed on May 17, 2022, which claims priority to Chinese Patent Application No. 202110565759.4, filed May 24, 2021. The entire contents of each of the above-identified applications are expressly incorporated herein by reference.

TECHNICAL FIELD

This application relates to the field of electronic product technologies, and specifically, to a force sensing module and an electronic device.

BACKGROUND

With the development and progress of terminal technologies, more manufacturers use a force sensing module instead of the original physical button to meet various human-computer interaction requirements.

At present, generally, one set of force sensing resistors are disposed respectively on the upper and lower surfaces of two steel sheets at intervals, so that the two sets of force sensing resistors on the upper and lower surfaces constitute a Wheatstone bridge structure, to achieve a sensing function of the force sensing module. However, due to the poor stress resistance of the force sensing resistor of the force sensing module, the distance between two steel sheets easily leads to the phenomenon that the force sensing resistor is pulled off in the assembly process of the force sensing module.

It can be seen that there is a problem of low yield in the assembly process of the force sensing module in the related art.

SUMMARY

This application provides a force sensing module and an electronic device.

According to a first aspect, an embodiment of this application provides a force sensing module, including: a first flexible circuit board, a substrate, and a second flexible circuit board stacked in sequence, where the substrate includes a first surface and a second surface disposed opposite to each other, and the first surface is provided with a first groove.

One side of the first flexible circuit board facing the first surface is disposed with a first force sensing resistor and a second force sensing resistor, and both the first force sensing resistor and the second force sensing resistor are across the first groove and attached to the first surface.

One side of the second flexible circuit board facing the second surface is disposed with a third force sensing resistor and a fourth force sensing resistor, the third force sensing resistor corresponds to the first force sensing resistor, the fourth force sensing resistor corresponds to the second force sensing resistor, and both the third force sensing resistor and the fourth force sensing resistor are attached to the second surface.

The first force sensing resistor, the second force sensing resistor, the third force sensing resistor, and the fourth force sensing resistor constitute a Wheatstone bridge structure, the force sensing module further includes a detection circuit electrically connected to the Wheatstone bridge structure, and the detection circuit is configured to detect a differential voltage of the Wheatstone bridge structure.

According to a second aspect, an embodiment of this application provides an electronic device, including a display screen and the force sensing module according to the first aspect, where the force sensing module is located at an inner side of the display screen.

In the embodiments of this application, the fixed structure between the first flexible circuit board and the second flexible circuit board is arranged as the substrate including the first groove to avoid the phenomenon that the force sensing resistor is easily pulled off due to the stiffness difference between the first flexible circuit board and the second flexible circuit board, thereby improving the yield of the force sensing module in the assembly process.

DETAILED DESCRIPTION

Figure 1:
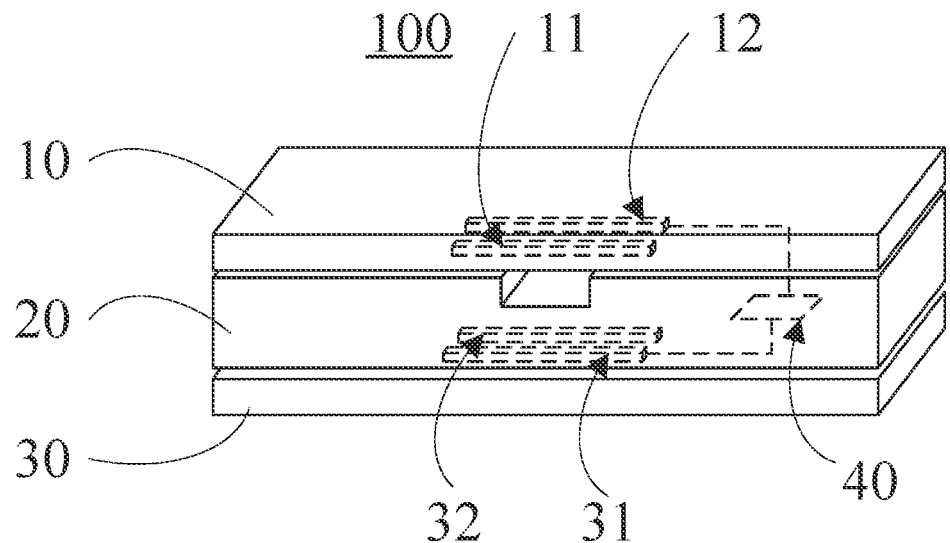
FIG. 1 is a first block diagram of a force sensing module according to an embodiment of this application.

Embodiments of this application are described in detail below, and examples of the embodiments are shown in accompanying drawings, where the same or similar elements or the elements having same or similar functions are denoted by the same or similar reference numerals throughout the description. The embodiments described below with reference to the accompanying drawings are exemplary and used only for explaining this application, and should not be construed as a limitation on this application. All other embodiments obtained by a person of ordinary skill in the art based on the embodiments of this application without creative efforts shall fall within the protection scope of this application.

A feature defined by terms "first" or "second" in this specification and claims of this application can explicitly or implicitly include one or more features. In the description of this application, unless otherwise stated, "a plurality of" means two or more than two. In addition, in this specification and the claims, "and/or" means at least one of the connected objects, and the character "/" generally indicates an "or" relationship between the associated objects.

In the description of this application, it should be noted that unless otherwise explicitly specified or defined, the terms such as "mount," "install," "connect," and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand the specific meanings of the foregoing terms in this application according to specific situations.

As shown in FIG. 1 to FIG. 10, an embodiment of this application provides a force sensing module 100, including: a first flexible circuit board 10, a substrate 20, and a second flexible circuit board 30 stacked in sequence. The substrate 20 includes a first surface 21 and a second surface 22 disposed opposite to each other, and the first surface 21 is provided with a first groove 23.

One side of the first flexible circuit board 10 facing the first surface 21 is disposed with a first force sensing resistor 11 and a second force sensing resistor 12, and both the first force sensing resistor 11 and the second force sensing resistor 12 are across the first groove 23 and attached to the first surface 21.

One side of the second flexible circuit board 30 facing the second surface 22 is disposed with a third force sensing resistor 31 and a fourth force sensing resistor 32, the third force sensing resistor 31 corresponds to the first force sensing resistor 11, the fourth force sensing resistor 32 corresponds to the second force sensing resistor 12, and both the third force sensing resistor 31 and the fourth force sensing resistor 32 are attached to the second surface 22.

The first force sensing resistor 11, the second force sensing resistor 12, the third force sensing resistor 31, and the fourth force sensing resistor 32 constitute a Wheatstone bridge structure 200, the force sensing module 100 further includes a detection circuit 40 electrically connected to the Wheatstone bridge structure 200, and the detection circuit 40 is configured to detect a differential voltage of the Wheatstone bridge structure 200.

In this embodiment, providing the first groove 23 on the substrate 20 to form an accommodating space required for deformation of the first force sensing resistor 11 and the second force sensing resistor 12 can effectively simplify the assembly process of the force sensing module 100 compared with providing a gap provided between two substrates. Moreover, due to the poor stiffness of the first flexible circuit board 10 and the second flexible circuit board 30, stacking the first flexible circuit board 10 and the second flexible circuit board 30 on the substrate 20 with an integral structure can improve the structural strength of the force sensing module 100.

In addition, since the force sensing resistor itself is brittle and has poor stress resistance, arranging a fixed structure between the first flexible circuit board 10 and the second flexible circuit board 30 as the substrate 20 including the first groove 23 can avoid the phenomenon that the force sensing resistor is easily pulled off due to the stiffness difference between the first flexible circuit board 10 and the second flexible circuit board 30, thereby improving the yield of the force sensing module in the assembly process.

Moreover, compared with using two spaced substrates as a support structure of the first flexible circuit board 10 and the second flexible circuit board 30, using the substrate 20 in this application as the support structure of the first flexible circuit board 10 and the second flexible circuit board 30 can not only enable the substrate 20 to effectively support the first flexible circuit board 10 and the second flexible circuit board 30, but also avoid displacement between the spaced two substrates in the assembly process, which affects the sensitivity and assembly yield of the force sensing module; and can further improve the reliability of the force sensing module in the transportation process, and avoid the phenomenon that the force sensing resistor of the force sensing module is pulled off.

Further, providing the first groove 23 on the substrate 20 can improve the opening precision of the first groove 23, so that the width of the first groove 23 can be designed as small as possible to improve the sensitivity of the force sensing module by reducing the width of the first groove 23.

In some implementations, a width of the first groove 23 is negatively correlated with a sensitivity of the force sensing module 100, that is, the sensitivity of the force sensing module 100 can be increased by reducing the width of the first groove 23; and/or a depth of the first groove 23 is positively correlated with the sensitivity of the force sensing module 100, that is, the sensitivity of the force sensing module 100 can be increased by increasing the depth of the first groove 23.

For example, when a thickness of the substrate 20 is small, the sensitivity of the force sensing module 100 can be increased by increasing the width of the first groove 23. When the substrate 20 is thick, the sensitivity of the force sensing module 100 can be increased by increasing the depth of the first groove 23.

It can be understood that when the force sensing module 100 senses deformation, which leads to a change of bridge resistance, a differential voltage of the Wheatstone bridge structure 200 detected by the detection circuit 40 also changes, and the change of the differential voltage can be transmitted to a processor, and amplified internally by the processor to sense the pressure sensed by the force sensing module 100, thereby achieving corresponding functions of the force sensing module 100, such as a power button function.

In an example, the detection circuit 40 is electrically connected to the Wheatstone bridge structure 200, which can be understood as that the detection circuit 40 is electrically connected to the first force sensing resistor 11, the second force sensing resistor 12, the third force sensing resistor 31, and the fourth force sensing resistor 32.

The processor and the detection circuit 40 can be disposed on the first flexible circuit board 10, or on the second flexible circuit board 30, or on the first flexible circuit board 10 and the second flexible circuit board 30 respectively. Moreover, the processor and the detection circuit 40 are electrically connected to implement signal transmission, thereby achieving the sensing function of the force sensing module 100.

In an example, when the force sensing module 100 is applied to an electronic device, the processor may be a central processing unit or a microprocessor of the electronic device, and the processor may be disposed on a main board of the electronic device and electrically connected to the detection circuit 40 disposed on the first flexible circuit board 10 or the second flexible circuit board 30.

Figure 2:
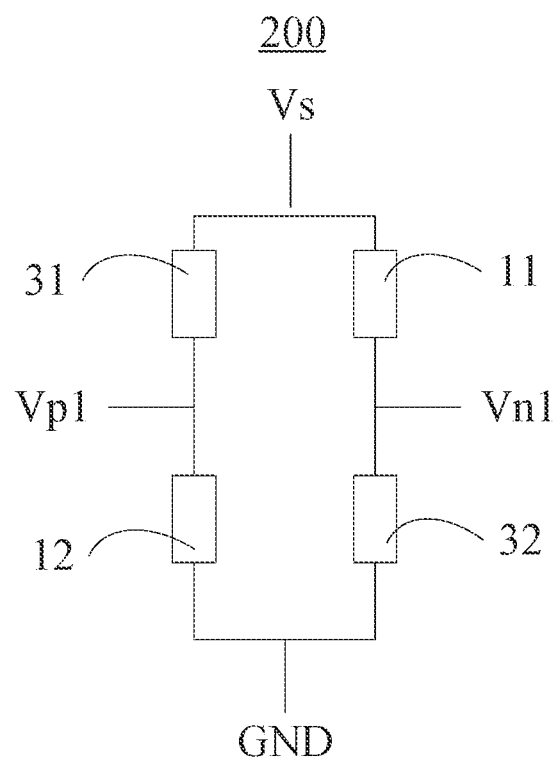
FIG. 2 is a block diagram of a Wheatstone bridge structure according to an embodiment of this application.
Figure 3:
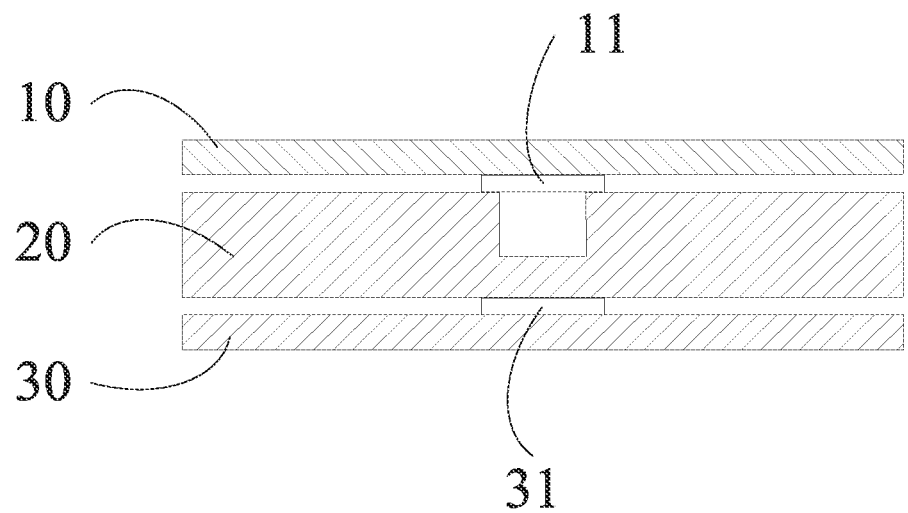
FIG. 3 is a second block diagram of a force sensing module according to an embodiment of this application.
Figure 4:
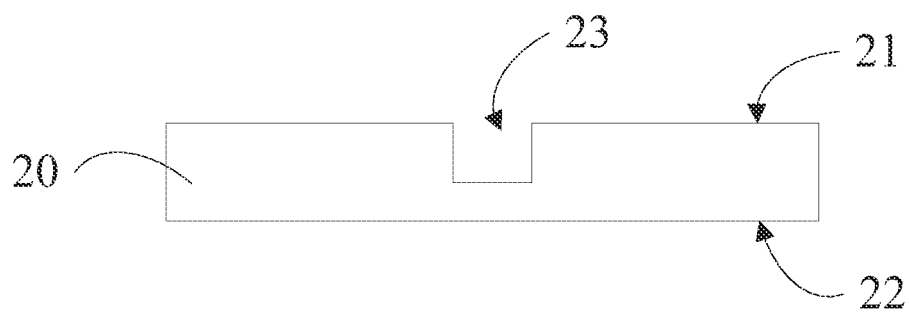
FIG. 4 is a first block diagram of a substrate according to an embodiment of this application.
Figure 5:
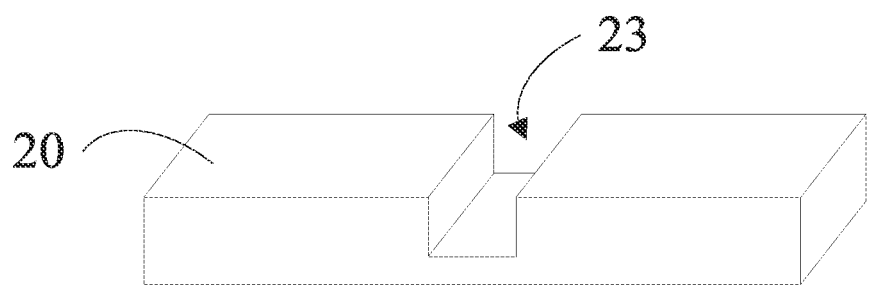
FIG. 5 is a second block diagram of a substrate according to an embodiment of this application.
Figure 6:
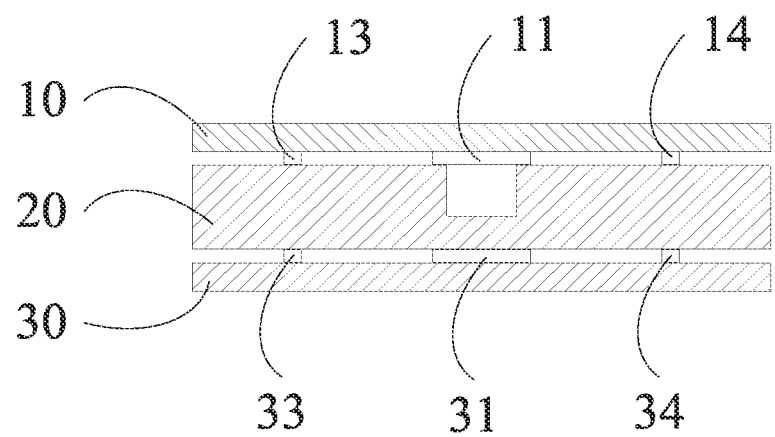
FIG. 6 is a third block diagram of a force sensing module according to an embodiment of this application.
Figure 7:
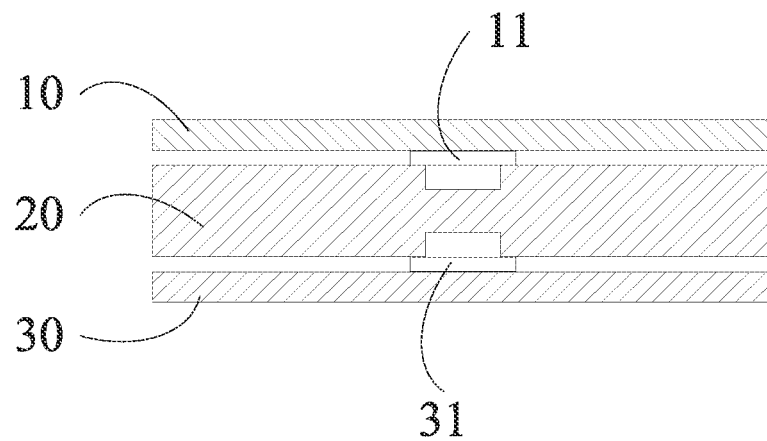
FIG. 7 is a fourth block diagram of a force sensing module according to an embodiment of this application.
Figure 8:
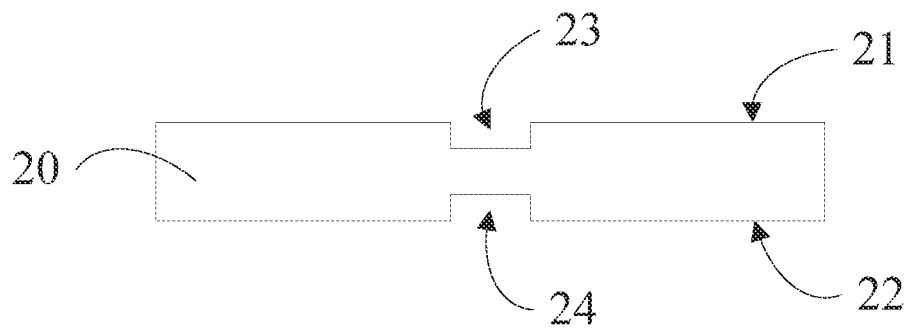
FIG. 8 is a third block diagram of a substrate according to an embodiment of this application.
Figure 9:
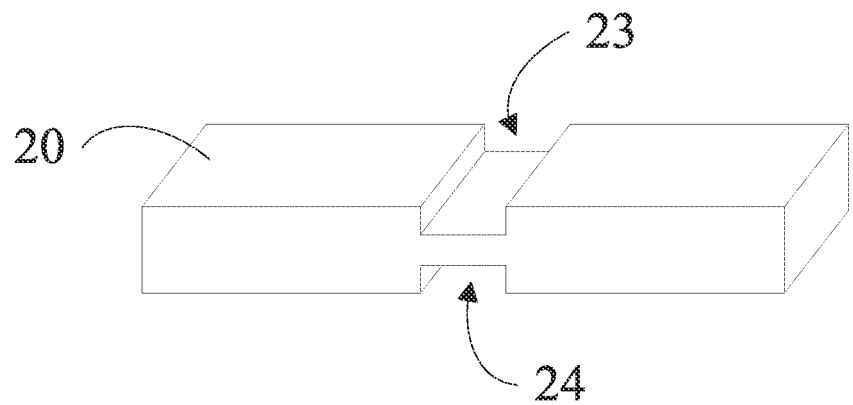
FIG. 9 is a fourth block diagram of a substrate according to an embodiment of this application.
Figure 10:
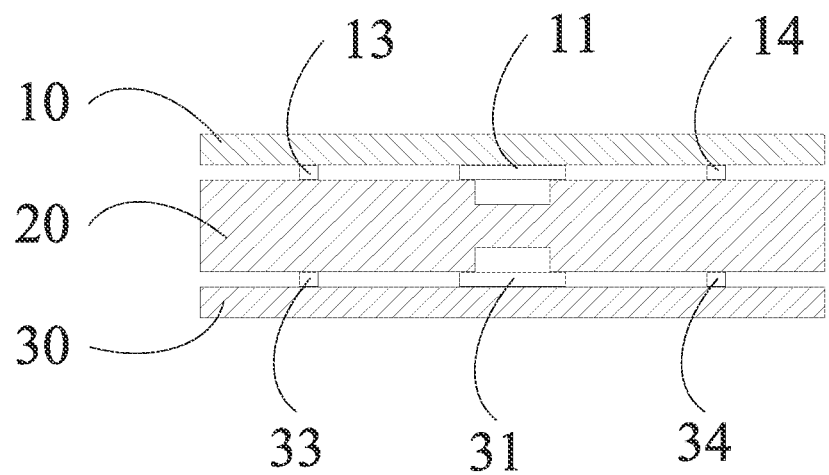
FIG. 10 is a fifth block diagram of a force sensing module according to an embodiment of this application.

When the first force sensing resistor 11, the second force sensing resistor 12, the third force sensing resistor 31, and the fourth force sensing resistor 32 constitute the Wheatstone bridge structure 200 shown in FIG. 2, and an external force acts on one side of the first flexible circuit board 10 of the force sensing module 100, the resistance of the first force sensing resistor 11 and the second force sensing resistor 12 being pressed decreases, and the resistance of the third force sensing resistor 31 and the fourth force sensing resistor 32 being pressed increases. Based on the working principle of the Wheatstone bridge, a voltage U can be obtained. Moreover, under the same pressure condition, the larger the voltage U, the higher the sensitivity of the force sensing module 100.

In an example, when the width of the first groove 23 is a, the length of the force sensing resistor being pressed changes to Δa, the length of the substrate 20 is L, the thickness of the substrate 20 is t, and the resistance change coefficient of the resistor is ε.

A formula of the resistance change coefficient of the resistor is ε=k*t/2*(L/a+1).

In this formula, k is related to the pressure of pressing. Under the same pressure condition, the voltage U and the change coefficient ε are positively correlated and in a linear relationship. Therefore, the sensitivity of the force sensing module 100 can be increased by increasing the thickness t of the substrate 20, or decreasing the width a of the first groove 23, or increasing the length L of the substrate 20.

In some implementations, the third force sensing resistor 31 and the fourth force sensing resistor 32 are across a projection area of the first groove 23 on the second surface 22, so that the sensitivity of the force sensing module 100 can be further increased.

In some implementations, the second surface 22 is provided with a second groove 24, the first groove 23 at least partially overlaps the second groove 24 in the projection area of the second surface 22, and the third force sensing resistor 31 and the fourth force sensing resistor 32 are across the second groove 24.

In this embodiment, the second groove 24 can form an accommodating space required for deformation of the third force sensing resistor 31 and the fourth force sensing resistor 32. Moreover, by providing the second groove 24, deformation points of the substrate 20 corresponding to the area of the second groove 24 is closer to the action area of the external force, so that the substrate 20 can produce greater deformation, even if the resistance change amount of the third force sensing resistor 31 and the fourth force sensing resistor 34 being pressed increases, thereby further improving the sensitivity of the force sensing module 100.

In an example, the second groove 24 may coincide with the projection area of the first groove 23 on the second surface 22.

In some implementations, the side of the first flexible circuit board 10 facing the first surface 21 are further disposed with a first temperature compensation resistor 13 and a second temperature compensation resistor 14, the first temperature compensation resistor 13 and the second temperature compensation resistor 14 are distributed on two opposite sides of the first groove 23, and both the first temperature compensation resistor 13 and the second temperature compensation resistor 14 are attached to the first surface 21.

In this embodiment, since the structures of the substrate 20 located on both sides of the first groove 23 are integrated, the accuracy of temperature compensation for the substrate 20 by the first temperature compensation resistor 13 and the second temperature compensation resistor 14 can be improved.

Furthermore, the side of the second flexible circuit board 30 facing the second surface 22 is further disposed with a third temperature compensation resistor 33 and a fourth temperature compensation resistor 34, the third temperature compensation resistor 33 and the fourth temperature compensation resistor 34 are distributed on two opposite sides of the second groove 24, and both the third temperature compensation resistor 33 and the fourth temperature compensation resistor 34 are attached to the second surface 22.

In this embodiment, since the structures of the substrate 20 located on both sides of the second groove 24 are integrated, the accuracy of temperature compensation for the substrate 20 by the third temperature compensation resistor 33 and the fourth temperature compensation resistor 34 can be improved.

In addition, the substrate 20 in this application may be a thermally conductive metal plate, so that the thermal conductivity of the substrate 20 can be improved, thereby improving the temperature consistency of the temperature compensation resistor and the force sensing resistor, and improving the accuracy of temperature compensation.

Figure 11:
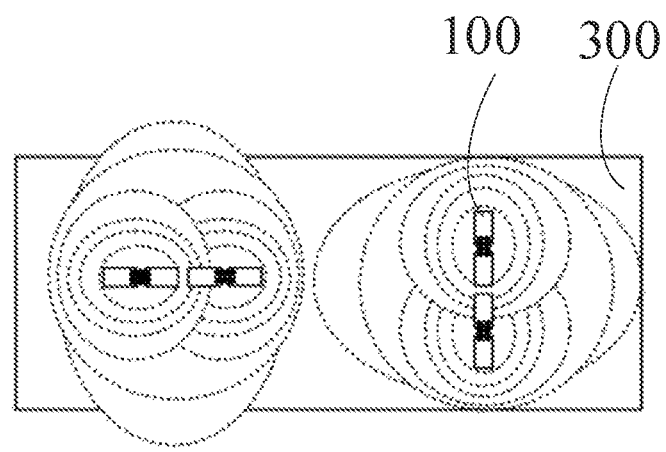
FIG. 11 is a block diagram of a force sensing module and a display screen according to an embodiment of this application.

As shown in FIG. 11, an embodiment of this application further provides an electronic device, including a display screen 300 and the above force sensing module 100, where the force sensing module 100 is located at an inner side of the display screen 300.

In an example, the first flexible circuit board of the force sensing module 100 is attached to the display screen 300, that is, the first groove of the force sensing module 100 is disposed close to the display screen 300. In this way, an under-screen pressure sensing function of the electronic device can be achieved.

In another example, the second flexible circuit board of the force sensing module 100 is attached to the display screen 300, that is, the first groove of the force sensing module 100 is disposed away from the display screen 300. In this way, the under-screen pressure sensing function of the electronic device can be achieved. Moreover, since the first groove is disposed away from the display screen 300, the distance between the pressure deformation points of the substrate and the display screen 300 is closer, leading to larger deformation of the substrate. It means the voltage U detected by the detection circuit 40 of the force sensing module 100 is larger, so that the sensitivity of the force sensing module 100 can be further improved.

In addition, the implementations of the above embodiments of the force sensing module 100 are also applicable to the embodiments of the electronic device and can achieve the same technical effect. Details are not described herein again.

The electronic device may be a mobile phone, a tablet computer, a notebook computer, a palmtop computer, a vehicle-mounted electronic device, a wearable device, an Ultra-Mobile Personal Computer (UMPC), a netbook, a Personal Digital Assistant (PDA), or the like.

In the descriptions of this specification, descriptions using reference terms "an embodiment," "some embodiments," "an exemplary embodiment," "an example," "a specific example," or "some examples" mean that specific characteristics, structures, materials, or features described with reference to the embodiment or example are included in at least one embodiment or example of this application. In this specification, exemplary descriptions of the foregoing terms do not necessarily refer to the same embodiment or example. Moreover, the described specific features, structures, materials, or characteristics may be combined in a proper manner in any one or more embodiments or examples.

Although the embodiments of this application have been shown and described, a person of ordinary skill in the art should understand that various changes, modifications, replacements and variations may be made to the embodiments without departing from the principles and spirit of this application, and the scope of this application is as defined by the appended claims and their equivalents.

What is claimed is:

1. A force sensing module, comprising:
   a first flexible circuit board;
   a substrate; and
   a second flexible circuit board, wherein:
   the first flexible circuit board, the substrate, and the second flexible circuit board are stacked in sequence;
   the substrate comprises a first surface and a second surface disposed opposite to the first surface, and the first surface is provided with a first groove;
   a first force sensing resistor and a second force sensing resistor are disposed on a side of the first flexible circuit board facing the first surface, and both the first force sensing resistor and the second force sensing resistor are across the first groove and attached to the first surface;
   a third force sensing resistor and a fourth force sensing resistor are disposed on a side of the second flexible circuit board facing the second surface, the third force sensing resistor corresponds to the first force sensing resistor, the fourth force sensing resistor corresponds to the second force sensing resistor, and both the third force sensing resistor and the fourth force sensing resistor are attached to the second surface; and
   the first force sensing resistor, the second force sensing resistor, the third force sensing resistor, and the fourth force sensing resistor form a Wheatstone bridge structure, the force sensing module further comprises a detection circuit electrically connected to the Wheatstone bridge structure, and the detection circuit is configured to detect a differential voltage of the Wheatstone bridge structure.

2. The force sensing module according to claim 1, wherein the second surface is provided with a second groove, the first groove at least partially overlaps the second groove in a projection area of the second surface, and both the third force sensing resistor and the fourth force sensing resistor are across the second groove.

3. The force sensing module according to claim 2, wherein the second groove coincides with the first groove on the projection area of the second surface.

4. The force sensing module according to claim 2, wherein the side of the first flexible circuit board facing the first surface is further disposed with a first temperature compensation resistor and a second temperature compensation resistor, the first temperature compensation resistor and the second temperature compensation resistor are distributed on two opposite sides of the first groove, and both the first temperature compensation resistor and the second temperature compensation resistor are attached to the first surface.

5. The force sensing module according to claim 4, wherein a third temperature compensation resistor and a fourth temperature compensation resistor are further disposed on the side of the second flexible circuit board facing the second surface, the third temperature compensation resistor and the fourth temperature compensation resistor are distributed on two opposite sides of the second groove, and both the third temperature compensation resistor and the fourth temperature compensation resistor are attached to the second surface.

6. The force sensing module according to claim 1, wherein a width of the first groove is negatively correlated with a sensitivity of the force sensing module, or a depth of the first groove is positively correlated with the sensitivity of the force sensing module.

7. The force sensing module according to claim 1, wherein the substrate is a thermally conductive metal sheet.

8. An electronic device, comprising:
   a display screen; and
   a force sensing module located at an inner side of the display screen, wherein the force sensing module comprises:
   a first flexible circuit board;
   a substrate; and
   a second flexible circuit board, wherein:
   the first flexible circuit board, the substrate, and the second flexible circuit board are stacked in sequence;
   the substrate comprises a first surface and a second surface disposed opposite to the first surface, and the first surface is provided with a first groove;
   a first force sensing resistor and a second force sensing resistor are disposed on a side of the first flexible circuit board facing the first surface, and both the first force sensing resistor and the second force sensing resistor are across the first groove and attached to the first surface;
   a third force sensing resistor and a fourth force sensing resistor are disposed on a side of the second flexible circuit board facing the second surface, the third force sensing resistor corresponds to the first force sensing resistor, the fourth force sensing resistor corresponds to the second force sensing resistor, and both the third force sensing resistor and the fourth force sensing resistor are attached to the second surface; and
   the first force sensing resistor, the second force sensing resistor, the third force sensing resistor, and the fourth force sensing resistor form a Wheatstone bridge structure, the force sensing module further comprises a detection circuit electrically connected to the Wheatstone bridge structure, and the detection circuit is configured to detect a differential voltage of the Wheatstone bridge structure.

9. The electronic device according to claim 8, wherein the second surface is provided with a second groove, the first groove at least partially overlaps the second groove in a projection area of the second surface, and both the third force sensing resistor and the fourth force sensing resistor are across the second groove.

10. The electronic device according to claim 9, wherein the second groove coincides with the first groove on the projection area of the second surface.

11. The electronic device according to claim 9, wherein the side of the first flexible circuit board facing the first surface is further disposed with a first temperature compensation resistor and a second temperature compensation resistor, the first temperature compensation resistor and the second temperature compensation resistor are distributed on two opposite sides of the first groove, and both the first temperature compensation resistor and the second temperature compensation resistor are attached to the first surface.

12. The electronic device according to claim 11, wherein a third temperature compensation resistor and a fourth temperature compensation resistor are further disposed on the side of the second flexible circuit board facing the second surface, the third temperature compensation resistor and the fourth temperature compensation resistor are distributed on two opposite sides of the second groove, and both the third temperature compensation resistor and the fourth temperature compensation resistor are attached to the second surface.

13. The electronic device according to claim 8, wherein a width of the first groove is negatively correlated with a sensitivity of the force sensing module, or a depth of the first groove is positively correlated with the sensitivity of the force sensing module.

14. The electronic device according to claim 8, wherein the substrate is a thermally conductive metal sheet.

15. The electronic device according to claim 8, wherein the first flexible circuit board of the force sensing module is attached to the display screen.

16. The electronic device according to claim 8, wherein the second flexible circuit board of the force sensing module is attached to the display screen.

* * * * *